(12) United States Patent
Penny et al.

(10) Patent No.: US 9,991,699 B2
(45) Date of Patent: Jun. 5, 2018

(54) ENABLEMENT OF DEVICE POWER-ON WITH PROPER ASSEMBLY

(71) Applicant: Microsoft Technology Licensing, LLC, Redmond, WA (US)

(72) Inventors: Junius Penny, Ben Lomond, CA (US); Agustya Mehta, Mountain View, CA (US); David Lukofsky, San Francisco, CA (US); Eugene Shoykhet, San Jose, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 94 days.

(21) Appl. No.: 15/144,088

(22) Filed: May 2, 2016

(65) Prior Publication Data

US 2017/0317490 A1    Nov. 2, 2017

(51) Int. Cl.
*H02J 7/00* (2006.01)
*H02H 11/00* (2006.01)
(Continued)

(52) U.S. Cl.
CPC .......... *H02H 11/003* (2013.01); *G01R 35/00* (2013.01); *G02B 27/017* (2013.01); *H02H 7/18* (2013.01);
(Continued)

(58) Field of Classification Search
CPC .... H02H 11/003; G02B 27/017; H02J 7/0042
(Continued)

(56) References Cited

U.S. PATENT DOCUMENTS

| 4,303,877 A | 12/1981 | Meinhold |
| 4,931,742 A | 6/1990 | Karash et al. |

(Continued)

FOREIGN PATENT DOCUMENTS

| WO | 2006055884 A2 | 5/2006 |
| WO | 2014188701 A1 | 11/2014 |

OTHER PUBLICATIONS

"International Search Report and Written Opinion Issued in PCT Application No. PCT/US2017/029990", dated Aug. 8, 2017, 10 Pages.

(Continued)

*Primary Examiner* — Drew A Dunn
*Assistant Examiner* — Zixuan Zhou
(74) *Attorney, Agent, or Firm* — Mark K. Young; Mayer & Williams PC

(57) ABSTRACT

An electronic device is configured with sub-assemblies including a main logic board, flexible printed circuit, and dual battery packs that are assembled together with electrical connectors to enable power from the battery packs to flow over a power bus that is distributed along the flexible printed circuit and main logic board. A protection circuit module (PCM) in each battery pack is configured to determine a state of each of the connections among the sub-assemblies (i.e., whether or not properly assembled to provide electrical continuity through the connector) so that power from the battery packs is switched on to the power bus only when electrical continuity is verified at each of the connectors. In the event that any connection is faulty, for example due to a misalignment of a connector during assembly that prevents electrical continuity to be established through a connector, neither PCM will switch power on to the power bus.

10 Claims, 14 Drawing Sheets

(51) Int. Cl.
  *G02B 27/01* (2006.01)
  *G01R 35/00* (2006.01)
  *H02H 7/18* (2006.01)

(52) U.S. Cl.
  CPC ......... *H02H 11/006* (2013.01); *H02J 7/0042* (2013.01); *G02B 2027/0178* (2013.01)

(58) Field of Classification Search
  USPC ........ 320/112, 114, 121, 128, 134, 136, 137
  See application file for complete search history.

(56) References Cited

U.S. PATENT DOCUMENTS

| | | | |
|---|---|---|---|
| 5,068,604 | A | 11/1991 | Van de Lagemaat |
| 5,784,626 | A * | 7/1998 | Odaohara ................. H02J 1/10 307/66 |
| 6,051,955 | A | 4/2000 | Saeki et al. |
| 6,548,206 | B1 | 4/2003 | Gauthier et al. |
| 7,243,317 | B2 | 7/2007 | Wang et al. |
| 7,537,720 | B2 | 5/2009 | Moon |
| 7,928,692 | B2 | 4/2011 | Carrier et al. |
| 8,846,221 | B2 | 9/2014 | Kim |
| 2005/0201585 | A1* | 9/2005 | Jannard ................. G02C 3/003 381/381 |
| 2009/0190273 | A1 | 7/2009 | Moran et al. |
| 2010/0194398 | A1 | 8/2010 | Kawasumi et al. |
| 2012/0166841 | A1 | 6/2012 | Holsen et al. |
| 2014/0233141 | A1 | 8/2014 | Blemel et al. |

OTHER PUBLICATIONS

Kovalcik, Michael., "Constructing a Lithium-Ion/Polymer Battery with an Imbedded Protection Circuit Module (PCM)", Retrieved on: Feb. 27, 2015 Available at: https://www.google.co.in/url sa=t&rct=j&q=&esrc=s&source=web&cd=1&cad=rja&uact=8&ved=0CB0QFjAA&url=http%3A%2F%2Fwww.egr.msu.edu%2Fclasses%2Fece480%2Fcapstone%2Ffall08%2Fgroup10%2Ffile%2FKovalcik_Application_Notes_ECE480_Team10_FS08doc&ei=Tbf2VPWtF5SsuQT04oHwDA&usg=AFQjCNFSMjKT1tdplMG-Mo8y5kkqLDINdA&bvm=bv.87519884,d.c2E.

"Single Cell Lithium-Ion Battery Protection IC W/Internal FET and Vov = 4.20V", Retrieved on: Feb. 27, 2015 Available at: http://www.ti.com/product/ucc3952-1 (2 pages total).

* cited by examiner

ENABLEMENT OF DEVICE POWER-ON WITH PROPER ASSEMBLY

BACKGROUND

Battery packs in battery-powered devices can provide high power and are typically protected using protection circuit modules or boards.

SUMMARY

An electronic device is configured with sub-assemblies including a main logic board, flexible printed circuit, and dual battery packs that are assembled together with electrical connectors to enable power from the battery packs to flow over a power bus that is distributed along the flexible printed circuit and main logic board. A protection circuit module (PCM) in each battery pack is configured to determine a state of each of the connections among the sub-assemblies (i.e., whether or not properly assembled to provide electrical continuity through the connector) so that power from the battery packs is switched on to the power bus only when electrical continuity is verified at each of the connectors. In the event that any connection is faulty, for example due to a misalignment of a connector during assembly that prevents electrical continuity to be established through a connector, neither PCM will switch power on to the power bus. By only enabling power-on when the connectors are properly assembled, the PCMs can mitigate against safety hazards and damage to the battery packs, flexible printed circuit, main logic board, and constituent devices and circuits that could be caused by a fault in the power bus from improper assembly.

In various illustrative examples, each PCM generates a low-power sensing signal that can be received by the other PCM over a sensing circuit that loops from battery pack to battery pack through each of the connectors, the flexible printed circuit, and the main logic board. Electrical continuity in the connectors is verified when each of the PCMs detects the sensing signal generated by the other PCM over the sensing circuit. The PCMs can then switch power from battery cells in each respective pack to the power bus to thereby enable the device to power-on. In the event of a fault, the sensing circuit can be configured in some implementations to enable identification of a connector that is improperly assembled. Such fault location capability can be utilized, for example, in troubleshooting during device assembly in a factory setting or during device repair in the field.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Furthermore, the claimed subject matter is not limited to implementations that solve any or all disadvantages noted in any part of this disclosure. These and various other features will be apparent from a reading of the following Detailed Description and a review of the associated drawings.

DESCRIPTION OF THE DRAWINGS

Like reference numerals indicate like elements in the drawings. Elements are not drawn to scale unless otherwise indicated.

DETAILED DESCRIPTION

Figure 1:
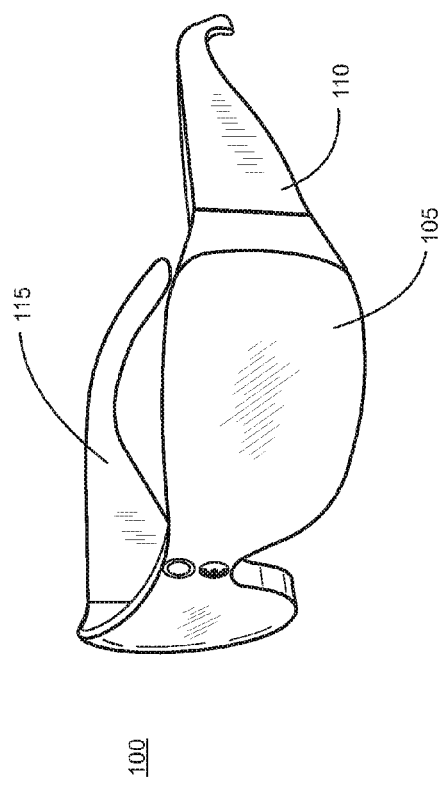
FIGS. 1 and 2 show respective three-quarter and top views of an illustrative example of a small form factor electronic device such as a wearable virtual reality or augmented reality head mounted display (HMD) device.
Figure 2:
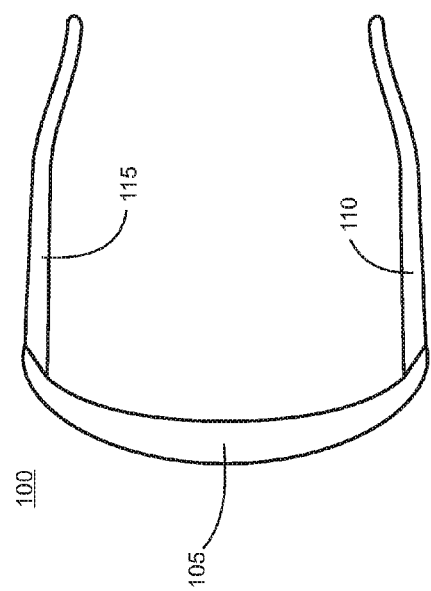

FIGS. 1 and 2 show respective three-quarter and top views of an illustrative example of a small form factor electronic device such as a wearable virtual reality or augmented reality head mounted display (HMD) device 100 with which the present enablement of device power-on with proper assembly may be utilized. However, the present arrangement is not limited to HMD devices in any way. The eyeglasses form factor of HMD device 100 is illustrative and other form factors may be utilized depending on the needs of a particular implementation. For example, the HMD device can utilize a band that encircles the user's head, be incorporated into a cap/hat, helmet, goggles, shields, visors, and the like. In this example, the HMD device 100 includes a front section 105 that is positioned proximate to the user's eyes, and left-side and right-side sections 110 and 115, respectively, that are located proximate to the sides of the user's head when the device 100 is worn. Each of sections 105, 110, and 115 of the HMD device 100 are configured to house and/or support various devices, components, and circuits as described below.

The HMD device 100 is battery-powered in typical implementations so that it can operate without being tethered to other equipment. However, it can also be configured to operate, for example, using a wired connection to a remote power source. In an illustrative example, the HMD device 100 employs dual battery packs in order to provide sufficient power storage to enable the device to operate within its design goals. One battery pack of the dual battery pack arrangement is disposed in the left-side section 110 of the HMD device 100, and another battery pack is disposed in the right-side section 115. The location of the battery packs in the side sections of the HMD device can allow favorable packaging and weight distribution in some implementations and may enable the HMD device to meet particular ergonomic goals and other design criteria. For example, the location of the packs can help maintain good balance and weigh distribution of the HMD device which may be an important design criterion given that the HMD is worn on the user's head.

Figure 3:
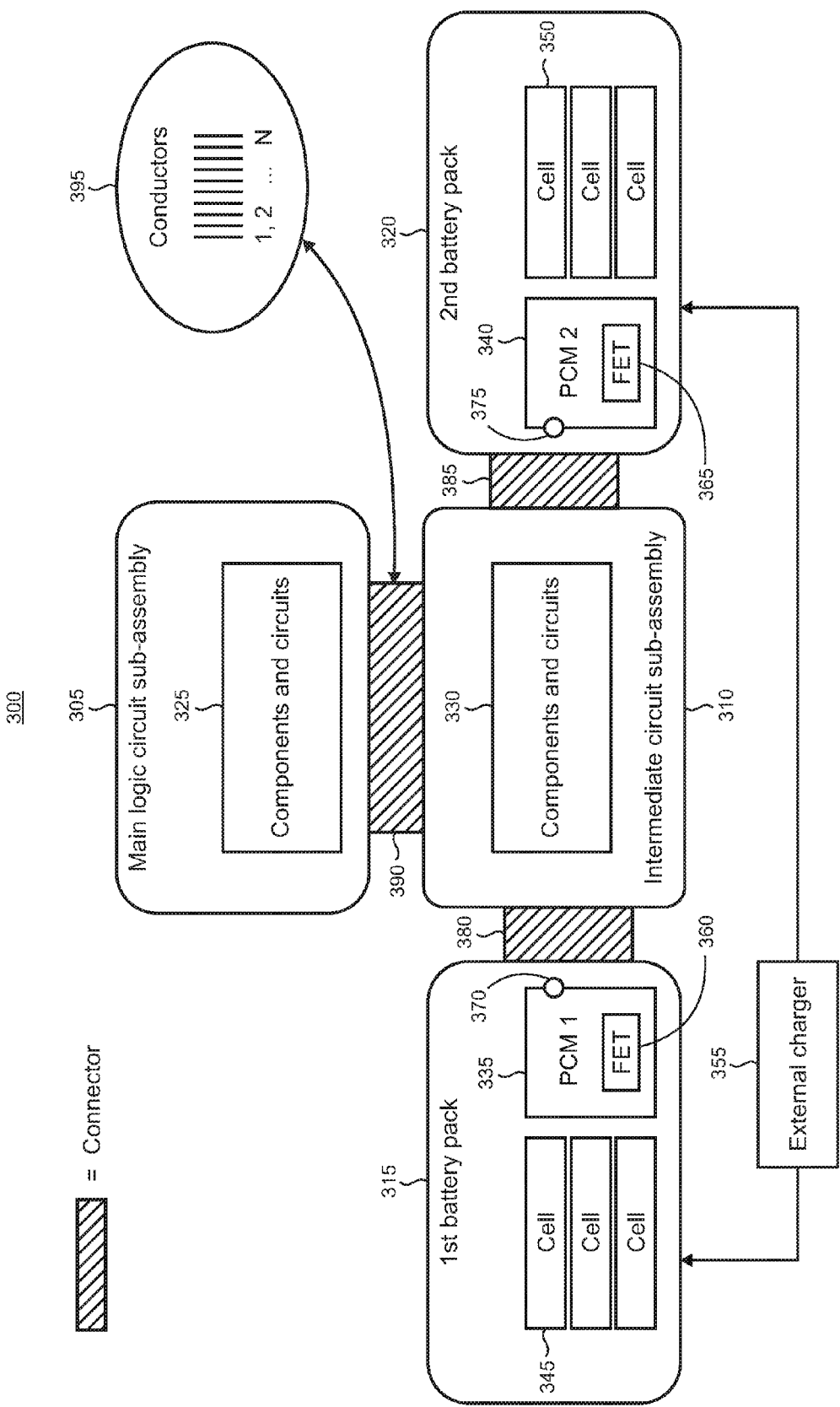
FIGS. 3, 4, and 5 are functional block diagrams of respective illustrative embodiments of assemblies that are usable in an electronic device.

FIG. 3 is a functional block diagram of an assembly 300 of sub-assemblies that may be utilized in an illustrative embodiment of the HMD device 100 (FIG. 1). Four sub-assemblies are provided including main logic circuit sub-assembly 305, and intermediate circuit sub-assembly 310, a first battery pack 315, and a second battery pack 320. The main logic circuit sub-assembly 305 and intermediate circuit sub-assembly 310 can comprise printed circuit boards, flexible printed circuits, rigid-flex printed circuits, or combinations thereof, and may support various components and circuits, as respectively indicated by reference numerals 325 and 330. Each battery pack includes a protection circuit module (PCM) 1 and PCM 2, respectively indicated by reference numerals 335 and 340, and one or more rechargeable battery cells, arranged in parallel in each battery pack in this example, as representatively indicated by reference numerals 345 and 350. The battery packs can interface with an external charger 355 that is configured to provide charging current to the battery cells in some situations.

The battery cells 345 and 350 may typically comprise lithium ion (Li-Ion) and/or lithium polymer (Li-Po) that can utilize various architectures. As the battery cells support high energy density, the PCMs are utilized to prevent damage to the batteries and other components and circuits in the HMD device and provide mitigation against electrical over-stress that could occur by overcurrent conditions and/or charging and discharging that exceed safe/design limits. Each PCM 335 and 340 can monitor battery cell voltage as well as current flow in its respective battery pack. Each PCM may incorporate an integrated circuit (IC) that controls the on/off state of one or more switches 360 and 365 that may be implemented, for example, as field-effect transistors (FETs) or metal-oxide-semiconductor field-effect transistors (MOSFETs). The PCMs 335 and 340 further include gates 370 and 375 that are configured to allow external on/off control of the FET switches 360 and 365 as described in more detail below.

The sub-assemblies 305, 310, 315, and 320 are assembled into the assembly 300 with connectors 380, 385, and 390. More specifically, the first battery pack sub-assembly 315 is operatively coupled to the intermediate circuit sub-assembly 310 with connector 380; the second battery pack sub-assembly 320 is operatively coupled to the intermediate circuit sub-assembly 310 with connector 385; and the intermediate circuit sub-assembly 310 is operatively coupled to the main logic circuit sub-assembly 305 with connector 390. Each of the connectors can be the same or different types and may typically comprise multiple parts that are respectively configured with mating features. Each connector can support one or more conductors as shown by reference numeral 395 to enable signal paths to be established with electrical continuity through the connector between the operatively coupled sub-assemblies.

Figure 4:
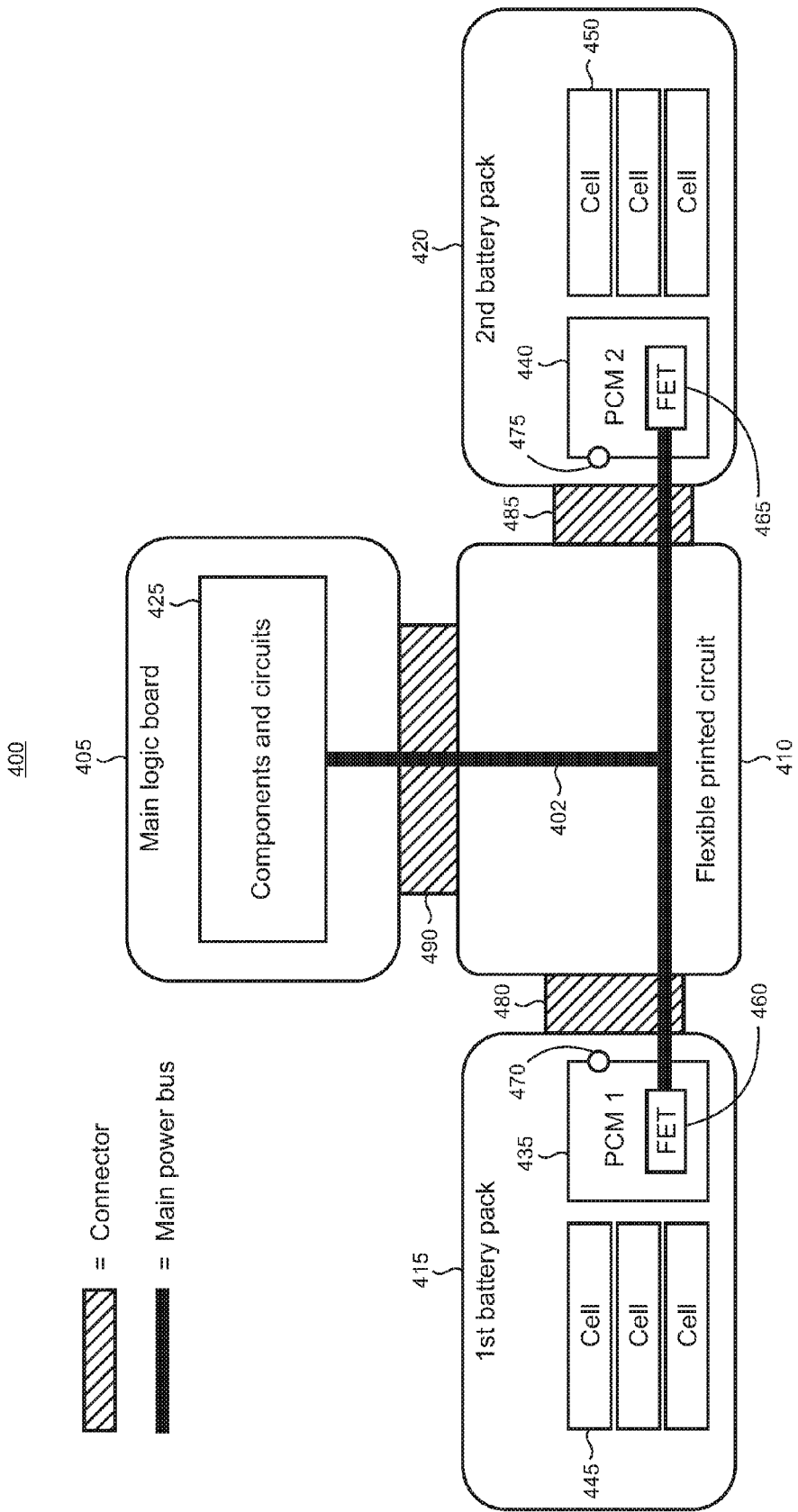

FIG. 4 is a functional block diagram of an assembly 400 of components that may be utilized in another illustrative embodiment of an electronic device such as the HMD device 100 (FIG. 1). In this example, a main logic board 405 is operatively coupled to a flexible printed circuit 410 with connector 490. The flexible printed circuit 410 is operatively coupled to a first battery pack 415 with connector 480 and is operatively coupled to a second battery pack 420 with connector 485.

Responsively to signals received at gates 470 and 475 (as described in more detail below), PCM 1 (indicated by reference numeral 435) and PCM 2 (440) are each configured to switch on power from the respective battery cells 445 and 450 to a main power bus 402 that is disposed along the flexible printed circuit 410 and main logic board 405 and runs through the three connectors 480, 485, and 490 from the FET switches 460 and 465 to components and circuits 425 on the main logic board.

The main power bus may take alternative configurations in some implementations. For example, as shown in the functional block diagram of an assembly 500 of components in FIG. 5, the main power bus 502 can be configured to supply power to a variety of components and circuits which can be distributed throughout the HMD device 100. Here, the main power bus 502 can supply power to components and circuits 504 that are disposed on the flexible printed circuit 410 as well as the components and circuits 425 disposed on the main logic board 405. In some implementations, the main power bus 502 can be extended to additional components and circuits 506 in other sub-assemblies such as a flexible printed circuit 508 that is operatively coupled to the main logic board 405 with a connector 510. For example, the flexible printed circuit 508 may support a peripheral device 512 such as an image sensor or other sensor that may be powered through the main power bus 502.

Figure 5:
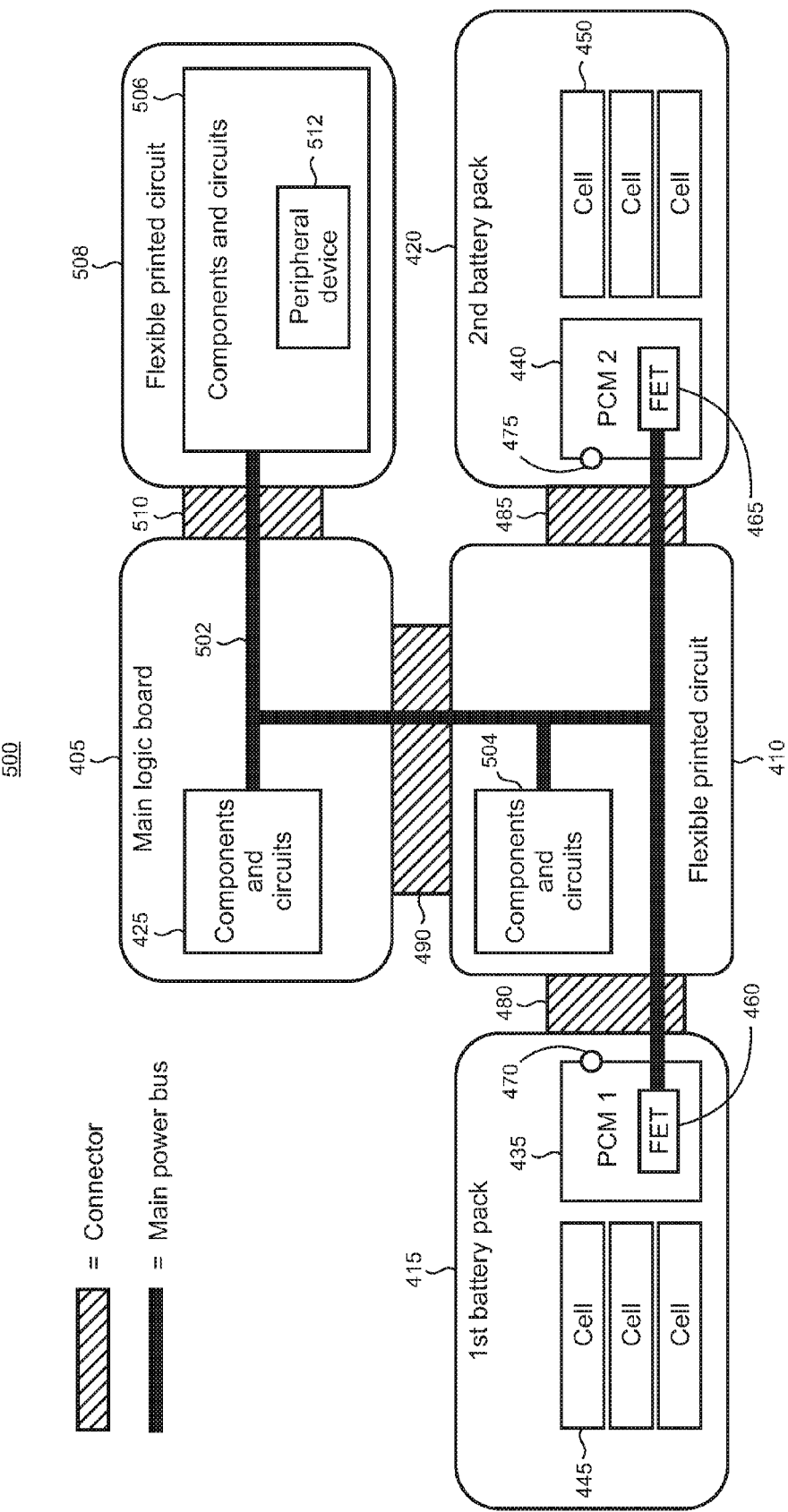

The HMD device 100 may be configured so that the PCMs have awareness of a state of each of the three connectors used in the assemblies shown in FIGS. 3, 4, and 5. That is, each PCM is configured to detect whether the battery packs, flexible printed circuit, and main logic board are properly assembled at each of the three connectors. The PCMs are configured to enable power-on to the HMD device 100 when certain state conditions are satisfied. As shown in the table 600 in FIG. 6, in an illustrative embodiment, PCM 1 confirms that four conditions (identified by reference numerals 605, 610, 615, and 620) are met in order to power on including: 1) the connection between PCM 1 and the flexible printed circuit (abbreviated as FPC in the drawing) is confirmed good whereby electrical continuity over one or more signal paths is established; 2) the connection between the main logic board (abbreviated as MLB in the drawing) and the flexible printed circuit is confirmed good whereby electrical continuity over one or more signal paths is established between PCM 1 and the main logic board through the flexible printed circuit; 3) the connection between PCM 2 and the flexible printed circuit is confirmed good whereby electrical continuity over one or more signal paths is established; and 4) the connection between the main logic board and the flexible printed circuit is confirmed good whereby electrical continuity over one or more signal paths is established between PCM 2 and the main logic board through the flexible printed circuit.

Likewise, PCM 2 confirms that four conditions (identified by reference numerals 625, 630, 635, and 640) are met in order to power on including: 1) the connection between PCM 2 and the flexible printed circuit is confirmed good whereby electrical continuity over one or more signal paths is established; 2) the connection between the main logic board and the flexible printed circuit is confirmed good whereby electrical continuity over one or more signal paths is established between PCM 2 and the main logic board through the flexible printed circuit; 3) the connection between PCM 1 and the flexible printed circuit is confirmed good whereby electrical continuity over one or more signal paths is established; and 4) the connection between main logic board and the flexible printed circuit is confirmed good whereby electrical continuity over one or more signal paths is established between PCM 1 and the main logic board through the flexible printed circuit.

Figure 6:
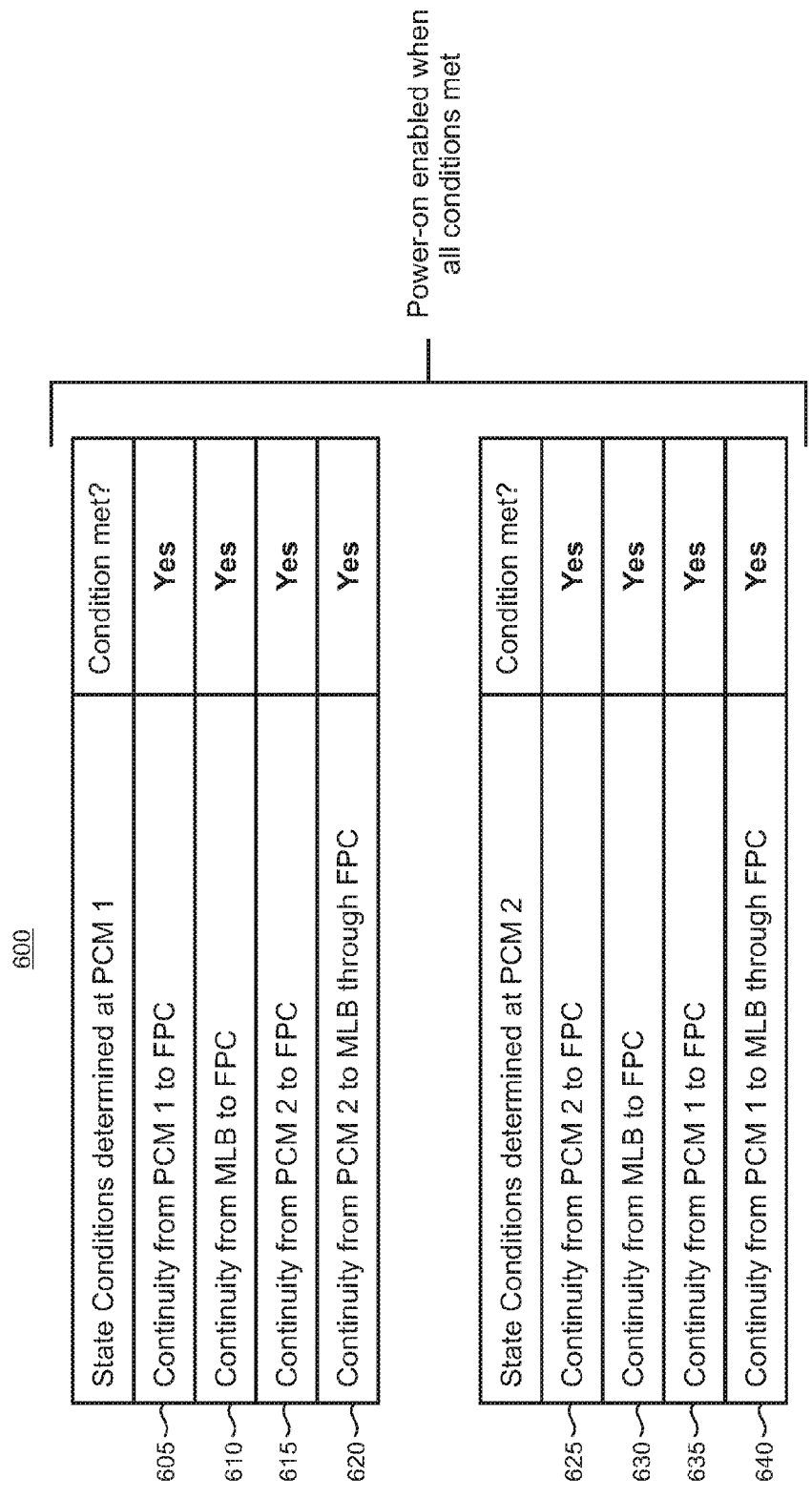
FIG. 6 is a table that shows illustrative conditions to be satisfied before power-on is enabled by protection circuit modules in an electronic device.

As table 600 in FIG. 6 shows, neither PCM will switch on power to the main power bus unless both PCMs confirm connector integrity at each connector used in the assembly. So, for example, PCM 1 will not attempt power-on if it is unable to confirm that PCM 2 is properly assembled at the connector with the flexible printed circuit and the flexible printed circuit is properly assembled at the connector with the main logic board. PCM 1 will not attempt power-on in this situation even if the connector state is such that PCM 1 has a good path to the main logic board through the flexible printed circuit on its own.

Figure 7:
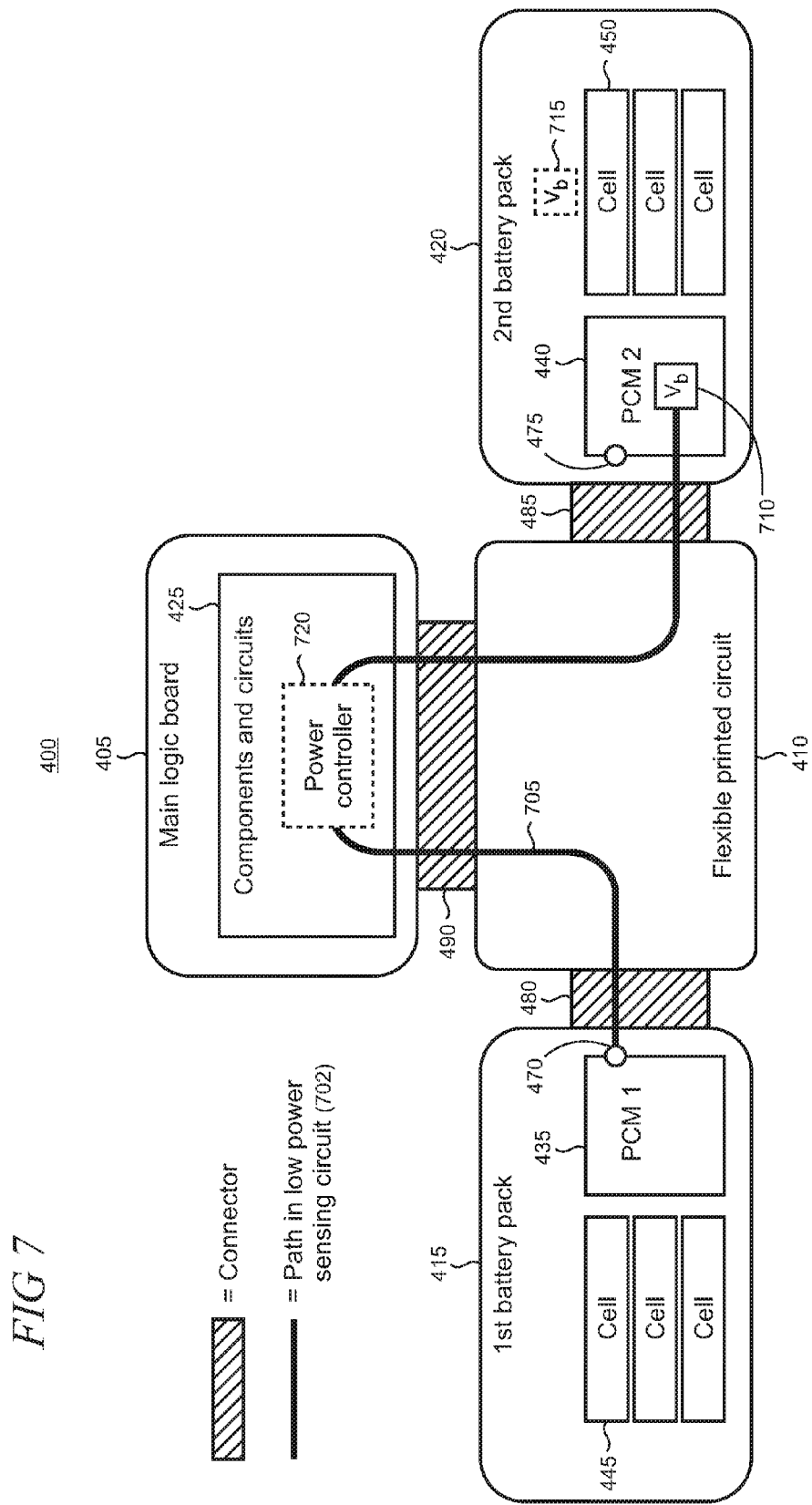
FIGS. 7 and 8 are functional block diagrams of respective illustrative embodiments of assemblies that are usable in an electronic device.
Figure 8:
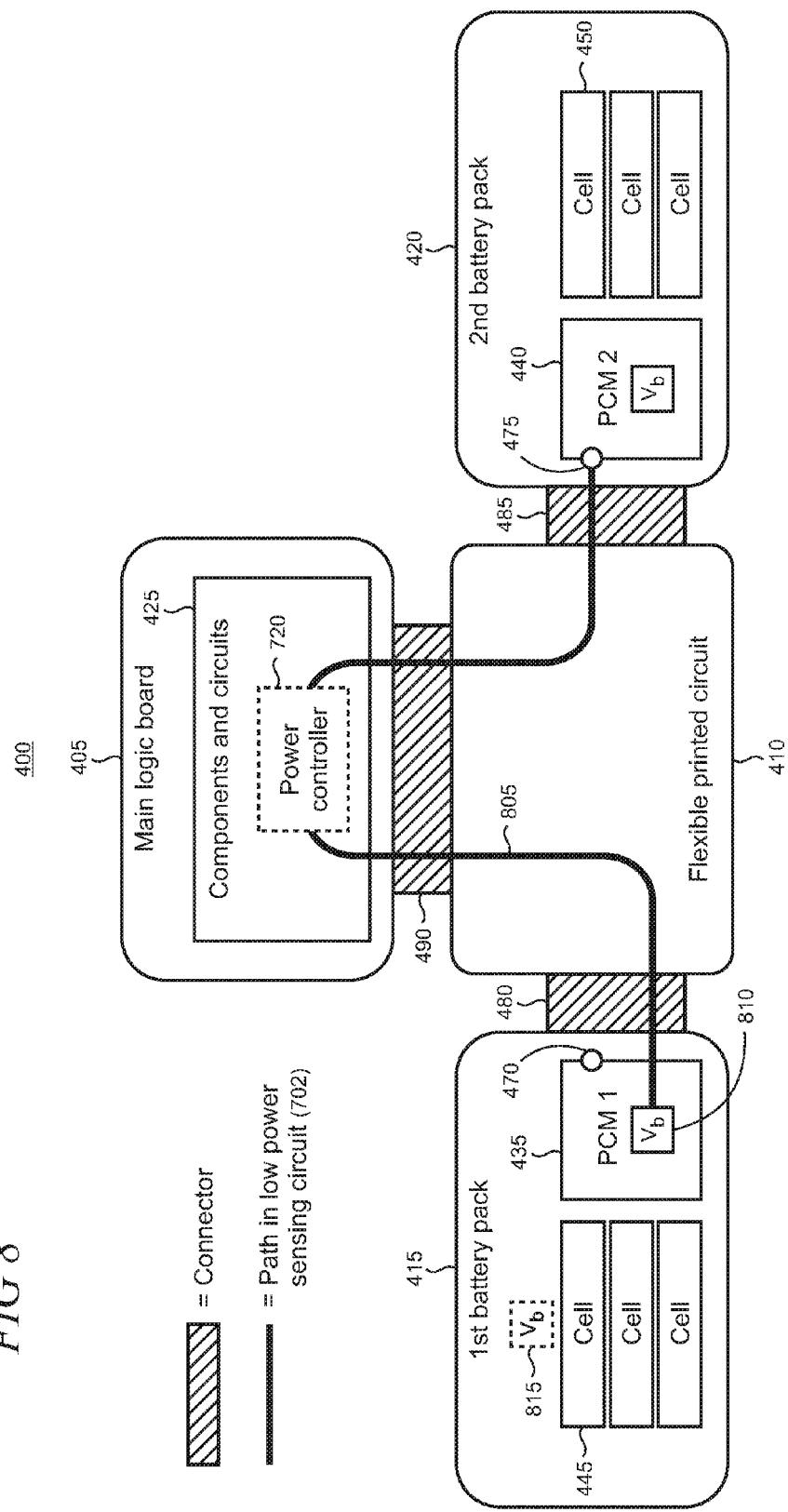

FIG. 7 shows an illustrative path 705 in a low power sensing circuit 702 that may be utilized by PCM 1 in the first battery pack 415 to determine connector state. FIG. 8 shows an illustrative path 805 in the low power sensing circuit that may be utilized by PCM 2 in the second battery pack 420 to determine connector state. Each path 705 and 805 may utilize one or more conductors 395 (FIG. 3) and the paths may overlap and share conductors in some implementations. Each path may also be configured to utilize conductors in the main power bus in some implementations. Each path 705 and 805 traverses each connector 480, 485, and 490 at least once. Referring to FIG. 7, path 705 runs from a low power source $V_b$ (indicated by reference numeral 710) provided in PCM 2 through connector 485, the flexible printed circuit 410, to the main logic board 405. Path 705 extends out of the main logic board 405 through the flexible printed circuit 410 and connector 480 to the gate 470 in PCM 1.

The low power source $V_b$ is typically configured to supply limited current so that the sensing circuit does not itself present a hazard or cause a short circuit or other fault in the event a connector is misconnected. While $V_b$ is shown as being tapped from PCM 2 over the path 705, $V_b$ may also be configured for provision by other components in the second battery pack, as indicated by reference numeral 715. For example, $V_b$ may be supplied by a component that interoperates with the external charger 355 (FIG. 3). A power controller 720 may be optionally disposed in the main logic board 405 and utilized to control the signal to the gate 470 in some cases. The controller 720 may also be configured to maintain awareness of connector state to supplement or replace the connector state awareness maintained by the PCMs.

Referring to FIG. 8, path 805 runs from a low power source $V_b$ (indicated by reference numeral 810) provided in PCM 1 through connector 480, the flexible printed circuit 410, to the main logic board 405. While $V_b$ is shown as being tapped from PCM 1 over the path 805, $V_b$ may also be configured for provision by other components in the first battery pack, as indicated by reference numeral 815. The power controller 720 may be optionally utilized to control the signal to the gate 475 in some cases. Path 805 extends out of the main logic board 405 through the flexible printed circuit 410 and connector 485 to the gate 475 in PCM 2. When the gates 470 and 475 in the respective first and second battery packs sense the $V_b$ signal over the low power sensing circuit, then the conditions shown in table 600 in FIG. 6 are met as the sensing circuit paths traverse each of the connectors. Accordingly, the FET switches in each PCM can enable power to flow to the main power bus for power-on. A misconnection in any connector that disrupts continuity in the sensing circuit prevents the $V_b$ signal from triggering the gate in a PCM.

Figure 9:
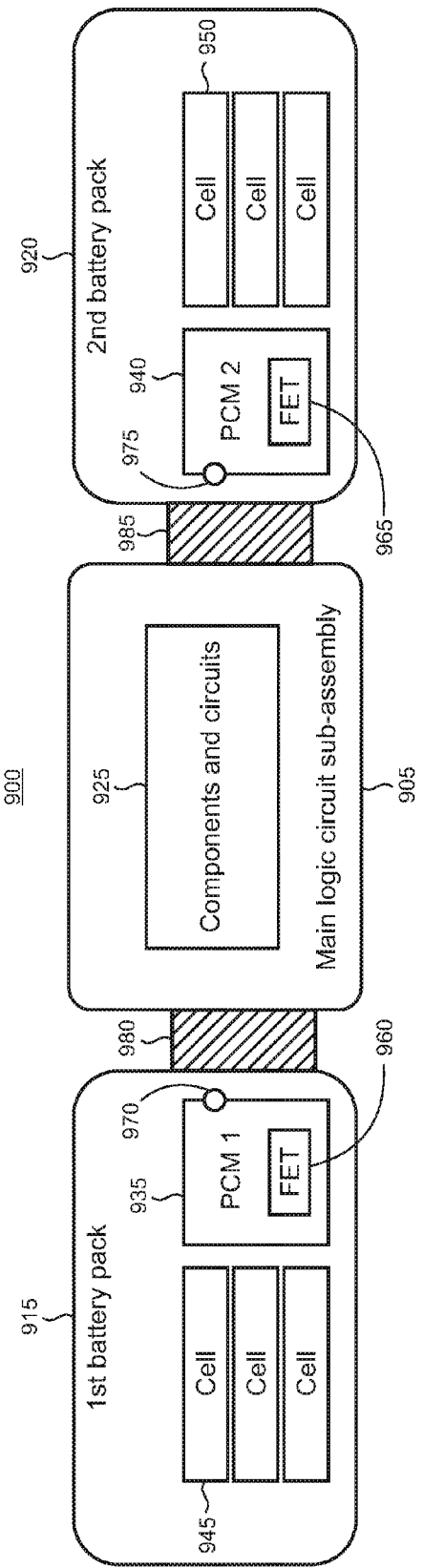
FIGS. 9, 10, and 11 are functional block diagrams of another illustrative embodiment of assemblies that are usable in an electronic device.
Figure 10:
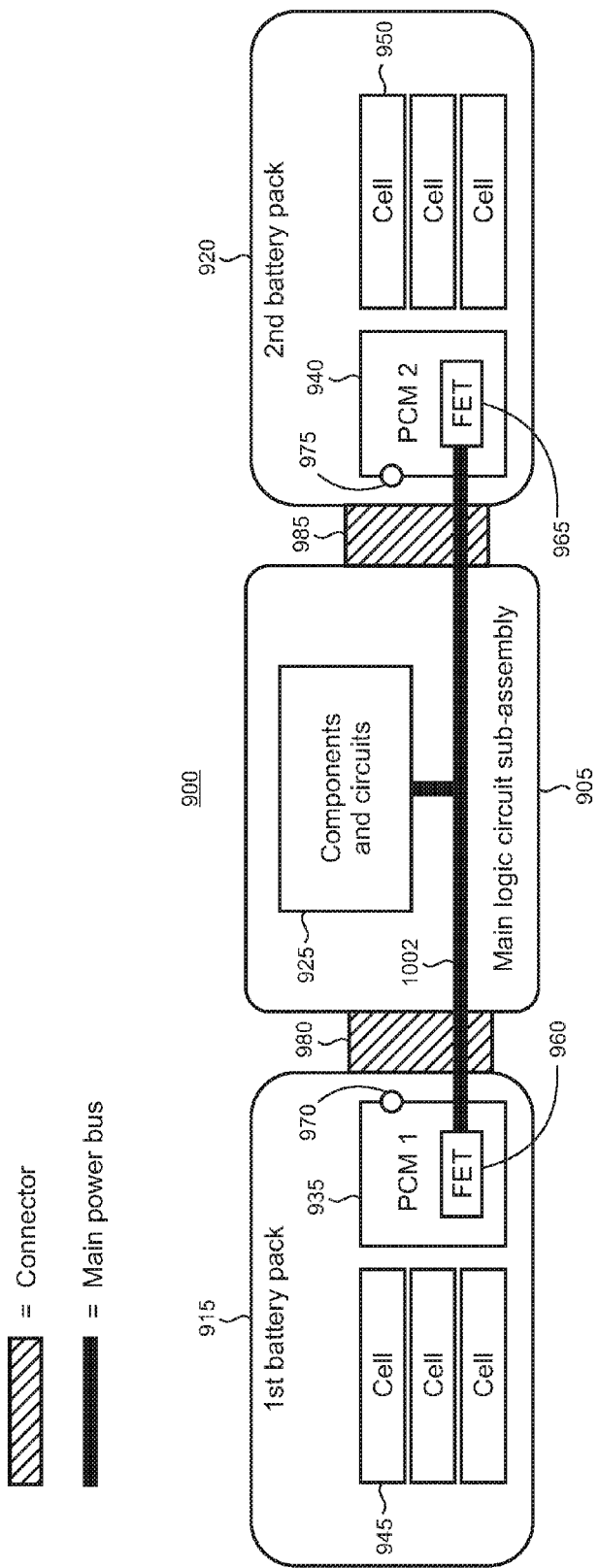
Figure 11:
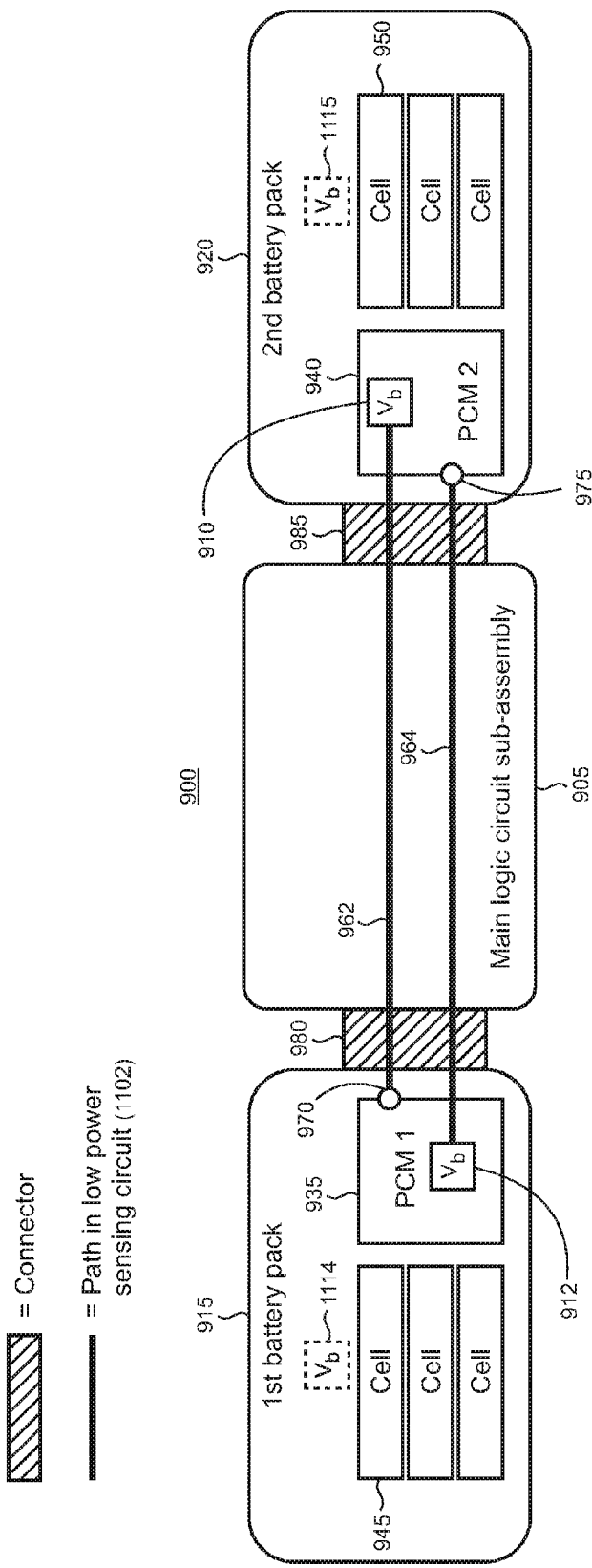

FIGS. 9, 10, and 11 show an alternative illustrative embodiment of an assembly 900 of components that may be utilized in an electronic device such as HMD device 100 (FIG. 1). In this embodiment, first and second battery packs 915 and 920 that include respective PCMs 935 and 940 and one or more battery cells 945 and 950. The PCMs 935 and 940 are operatively coupled through respective connectors 980 and 985 to a main logic circuit sub-assembly 905 that includes various components and circuits 925. The main logic circuit sub-assembly 905 may comprise a printed circuit board, flexible printed circuit, rigid-flex printed circuit, or combination thereof. The PCMs 935 and 940 include respective switches 960 and 965 such as FETs for which on/off state may be controlled by gates 970 and 975.

As shown in FIG. 10, responsively to signals received at gates 970 and 975 the PCMs 935 and 940 are each configured to switch on power from the respective battery cells 945 and 950 to a main power bus 1002 that is disposed in the main logic circuit assembly and runs through the connectors 980 and 985 from the FET switches 960 and 965 to the components and circuits 925. A power controller (not shown) may be optionally disposed in the main logic circuit sub-assembly 905 and utilized to control signals to the gates 970 and 975 in some cases.

In a similar manner as with the illustrative three connector embodiment shown in FIGS. 7 and 8 and described in the accompanying text, neither PCM 935 nor 940 will switch on power to the main power bus 1002 unless both PCMs confirm connector integrity at each connector 980 and 985 used in the assembly 900. FIG. 11 shows illustrative paths 962 and 964 in a low power sensing circuit 1102 that may be used by the PCMs to determine connector state. Each of the paths 962 and 964 may utilize one or more conductors and the paths may overlap and share conductors in some implementations. Each path may also be configured to utilize conductors in the main power bus in some implementations. Each path traverses each connector 980 and 985 at least once.

As shown, path 962 runs from a low power source $V_b$ 910 provided in PCM 2 through connector 985, the main logic circuit sub-assembly 905, and connector 980 to the gate 970 in PCM 1. While $V_b$ is shown as being tapped from PCM 2 over the path 962, $V_b$ may also be configured for provision by other components in the second battery pack, as indicated by reference numeral 1115. Path 964 runs from a low power source $V_b$ 912 provided in PCM 1 through connector 980, the main logic circuit sub-assembly 905, and connector 985 to the gate 975 in PCM 2. While $V_b$ is shown as being tapped from PCM 1 over the path 965, $V_b$ may also be configured for provision by other components in the first battery pack, as indicated by reference numeral 1114.

When the gates 970 and 975 in the respective first and second battery packs sense the $V_b$ signal over the low power sensing circuit, then connector integrity at the connectors 980 and 985 is confirmed as the sensing circuit paths traverse each of the connectors. Accordingly, the FET switches in each PCM can enable power to flow to the main power bus 1002 (FIG. 10) for power-on. A misconnection in any connector that disrupts continuity in the sensing circuit prevents the $V_b$ signal from triggering the gate in a PCM.

Figure 12:
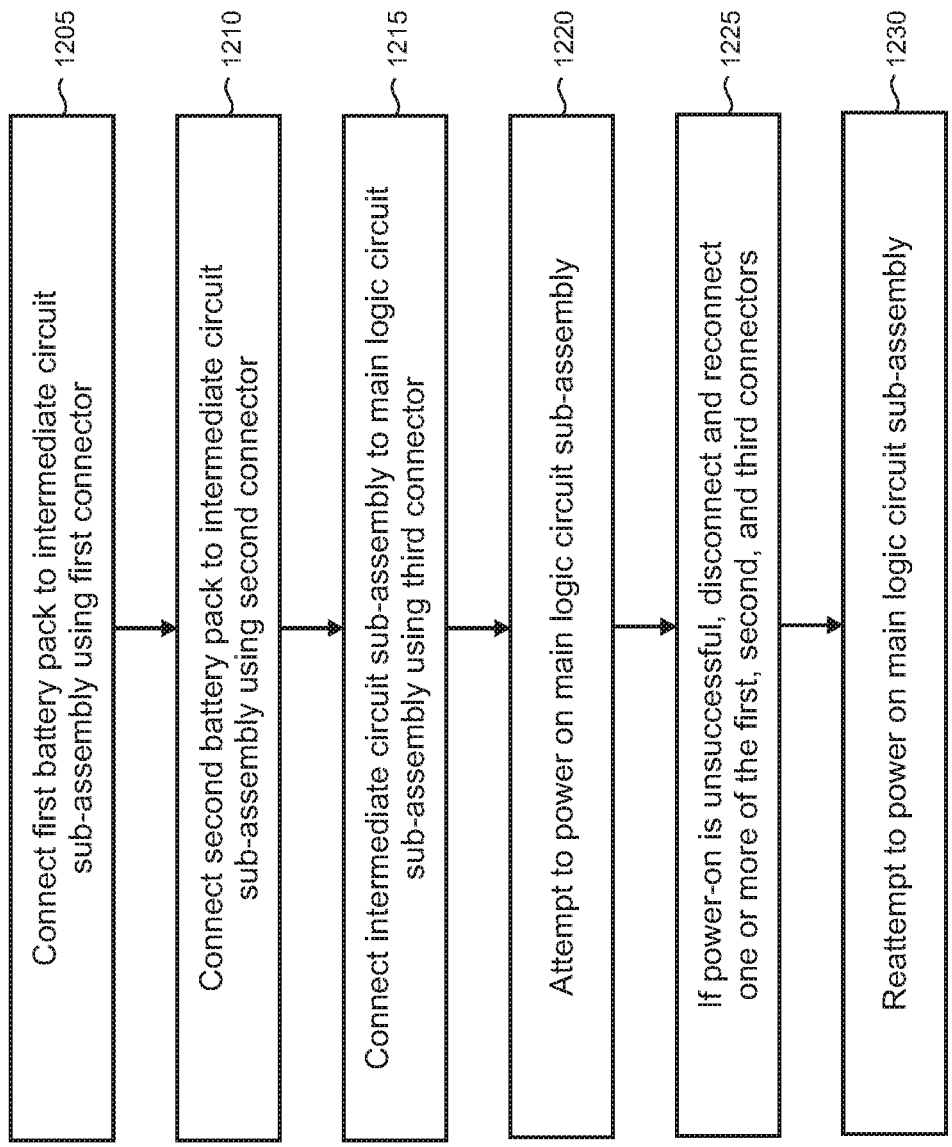
FIG. 12 is a flowchart of an illustrative method for assembling sub-assemblies in an electronic device.

FIG. 12 is a flowchart of an illustrative method 1200 for assembling sub-assemblies that may be used in an electronic device such as the HMD device 100 (FIG. 1). The method 1200 may be performed, for example, by a human operator, machine, or combination of operator and machine in a factory environment when the device is assembled in a factory setting. Alternatively, method 1200 may be utilized in the field when the device is repaired or maintained, typically by a human operator. Unless specifically stated, the methods or steps shown in the flowchart 1200 and described in the accompanying text are not constrained to a particular order or sequence. In addition, some of the methods or steps thereof can occur or be performed concurrently and not all the methods or steps have to be performed in a given implementation depending on the requirements of such implementation and some methods or steps may be optionally utilized.

At step 1205, a first battery pack is operatively coupled to an intermediate circuit sub-assembly (e.g., flexible printed circuit 410 in FIG. 4) using a first connector. At step 1210, a second battery pack is operatively coupled to the intermediate circuit sub-assembly using a second connector. At step 1215, the intermediate circuit sub-assembly is operatively coupled to a main logic circuit sub-assembly (e.g., main logic board 405 in FIG. 4) using a third connector.

At step 1220, after the sub-assemblies and battery packs are connected, power-on to the main logic circuit assembly may be attempted. The main logic circuit assembly, intermediate circuit sub-assembly, or one or more of the battery packs may include on-board components such as displays, indicators, code generators, or other suitable devices that indicate a successful power-on. Alternatively, one or more of the sub-assemblies may be configured with a port or other suitable interface that communicates with external diagnostic and/or monitoring equipment that may be configured to indicate power-on status. Various tests may be performed to verify proper assembly and connector integrity. At step 1225, if power-on is unsuccessful, then one or more of the three connectors may be disconnected and then reconnected, and power-on reattempted at step 1230.

As discussed above, the present enablement of device power-on with proper assembly may be incorporated into one or more systems that are utilized in a virtual or mixed reality display device. Such device may take any suitable form, including but not limited to near-eye devices such as an HMD device. A see-through display may be used in some implementations while an opaque (i.e., non-see-through) display using a camera-based pass-through or outward facing sensor, for example, may be used in other implementations.

Figure 13:
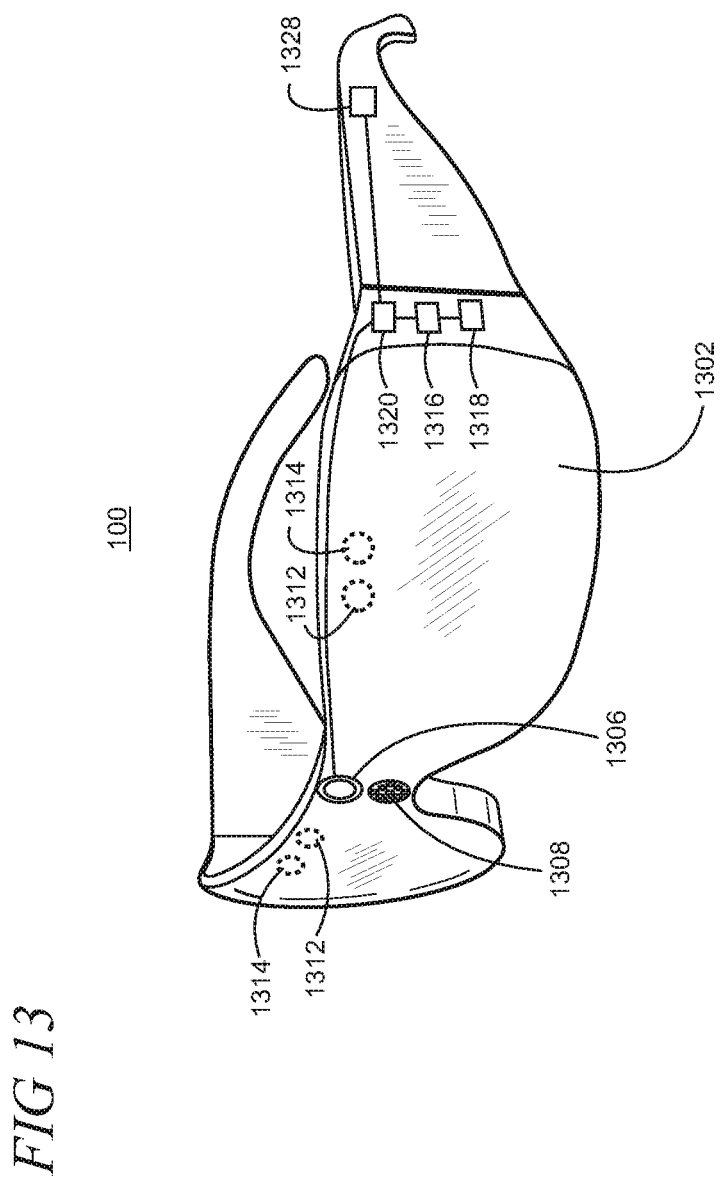
FIG. 13 is a pictorial view showing additional details of the illustrative virtual reality or augmented reality HMD device shown in FIGS. 1 and 2.
Figure 14:
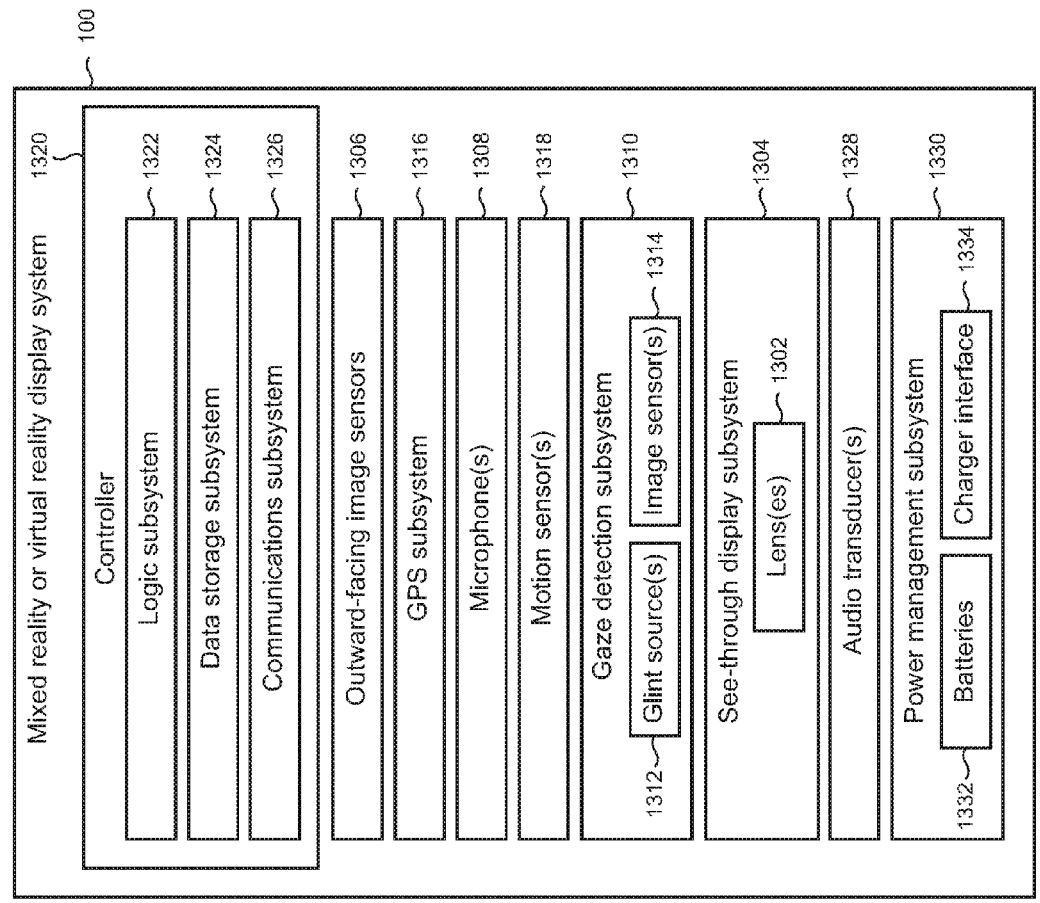
FIG. 14 shows a functional block diagram of the illustrative example of a virtual reality or augmented reality HMD device shown in FIGS. 1, 2, and 13.

FIG. 13 is a pictorial view showing additional details of the illustrative virtual reality or augmented reality HMD device 100 shown in FIGS. 1 and 2, and FIG. 14 shows a functional block diagram of the device 100. HMD device 100 comprises one or more lenses 1302 that form a part of a see-through display subsystem 1304, such that images may be displayed using lenses 1302 (e.g. using projection onto lenses 1302, one or more waveguide systems incorporated into the lenses 1302, and/or in any other suitable manner). HMD device 100 further comprises one or more outward-facing image sensors 1306 configured to acquire images of a background scene and/or physical environment being viewed by a user, and may include one or more microphones 1308 configured to detect sounds, such as voice commands from a user. Outward-facing image sensors 1306 may include one or more depth sensors and/or one or more two-dimensional image sensors. In alternative arrangements, as noted above, an augmented reality or virtual reality HMD device, instead of incorporating a see-through display subsystem, may display augmented reality or virtual reality images through a viewfinder mode for an outward-facing image sensor.

The HMD device 100 may further include a gaze detection subsystem 1310 configured for detecting a direction of gaze of each eye of a user or a direction or location of focus, as described above. Gaze detection subsystem 1310 may be configured to determine gaze directions of each of a user's eyes in any suitable manner. For example, in the illustrative example shown, a gaze detection subsystem 1310 includes one or more glint sources 1312, such as infrared light sources, that are configured to cause a glint of light to reflect from each eyeball of a user, and one or more image sensors 1314, such as inward-facing sensors, that are configured to capture an image of each eyeball of the user. Changes in the glints from the user's eyeballs and/or a location of a user's pupil, as determined from image data gathered using the image sensor(s) 1314, may be used to determine a direction of gaze.

In addition, a location at which gaze lines projected from the user's eyes intersect the external display may be used to determine an object at which the user is gazing (e.g. a displayed virtual object and/or real background object). Gaze detection subsystem 1310 may have any suitable number and arrangement of light sources and image sensors. In some implementations, the gaze detection subsystem 1310 may be omitted.

The HMD device 100 may also include additional sensors. For example, HMD device 100 may comprise a global positioning system (GPS) subsystem 1316 to allow a location of the HMD device 100 to be determined. This may help to identify real-world objects, such as buildings, etc. that may be located in the user's adjoining physical environment.

The HMD device 100 may further include one or more motion sensors 1318 (e.g., inertial, multi-axis gyroscopic, or acceleration sensors) to detect movement and position/orientation/pose of a user's head when the user is wearing the system as part of an augmented reality or virtual reality HMD device. Motion data may be used, potentially along with eye-tracking glint data and outward-facing image data, for gaze detection, as well as for image stabilization to help correct for blur in images from the outward-facing image sensor(s) 1306. The use of motion data may allow changes in gaze location to be tracked even if image data from outward-facing image sensor(s) 1306 cannot be resolved.

In addition, motion sensors 1318, as well as microphone(s) 1308 and gaze detection subsystem 1310, also may be employed as user input devices, such that a user may interact with the HMD device 100 via gestures of the eye, neck and/or head, as well as via verbal commands in some cases. It may be understood that sensors illustrated in FIGS. 13 and 14 and described in the accompanying text are included for the purpose of example and are not intended to be limiting in any manner, as any other suitable sensors and/or combination of sensors may be utilized to meet the needs of a particular implementation. For example, biometric sensors (e.g., for detecting heart and respiration rates, blood pressure, brain activity, body temperature, etc.) or environmental sensors (e.g., for detecting temperature, humidity, elevation, UV (ultraviolet) light levels, etc.) may be utilized in some implementations.

The HMD device 100 can further include a controller 1320 having a logic subsystem 1322 and a data storage subsystem 1324 in communication with the sensors, gaze detection subsystem 1310, display subsystem 1304, and/or other components through a communications subsystem 1326. The communications subsystem 1326 can also facilitate the HMD device being operated in conjunction with remotely located resources, such as processing, storage, power, data, and services. That is, in some implementations, an HMD device can be operated as part of a system that can distribute resources and capabilities among different components and subsystems.

The storage subsystem 1324 may include instructions stored thereon that are executable by logic subsystem 1322, for example, to receive and interpret inputs from the sensors, to identify location and movements of a user, to identify real objects using surface reconstruction and other techniques, and dim/fade the display based on distance to objects so as to enable the objects to be seen by the user, among other tasks.

The HMD device 100 is configured with one or more audio transducers 1328 (e.g., speakers, earphones, etc.) so that audio can be utilized as part of an augmented reality or virtual reality experience. A power management subsystem 1330 may include one or more batteries 1332 and/or protection circuit modules (PCMs) and an associated charger interface 1334 and/or remote power interface for supplying power to components in the HMD device 100.

It may be appreciated that the HMD device 100 is described for the purpose of example, and thus is not meant to be limiting. It may be further understood that the display device may include additional and/or alternative sensors, cameras, microphones, input devices, output devices, etc. than those shown without departing from the scope of the present arrangement. Additionally, the physical configuration of a display device and its various sensors and subcomponents may take a variety of different forms without departing from the scope of the present arrangement.

Figure 15:
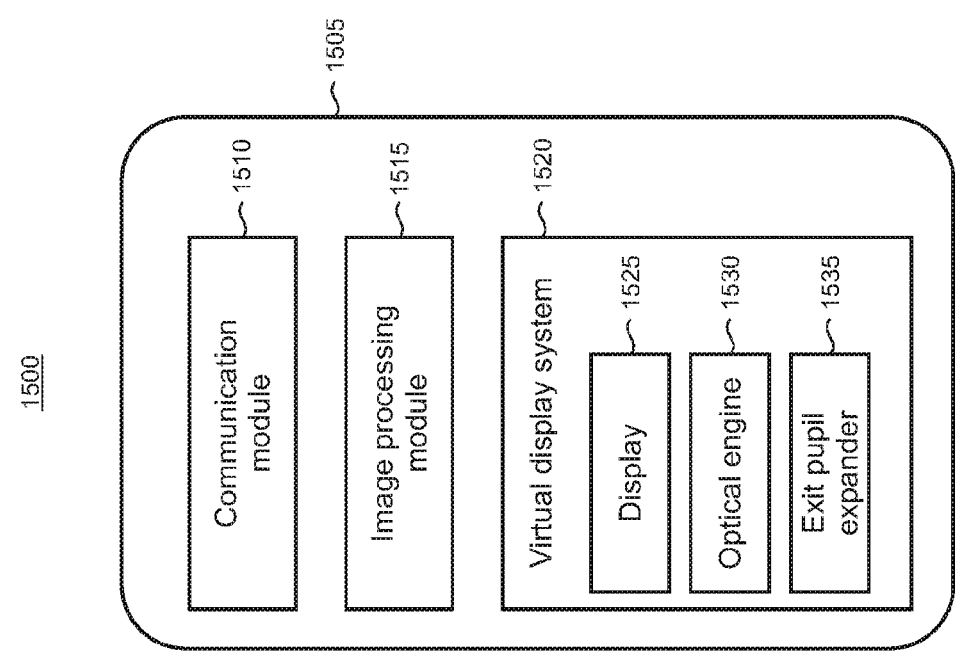
FIG. 15 shows a block diagram of an illustrative electronic device that incorporates an augmented reality or virtual reality display system.

As shown in FIG. 15, an augmented reality or virtual reality display system using the present enablement of device power-on with proper assembly can be used in a mobile or portable electronic device 1500, such as a mobile phone, smartphone, personal digital assistant (PDA), communicator, portable Internet appliance, hand-held computer, digital video or still camera, wearable computer, computer game device, specialized bring-to-the-eye product for viewing, or other portable electronic device. As shown, the portable device 1500 includes a housing 1505 to house a communication module 1510 for receiving and transmitting information from and to an external device, or a remote system or service (not shown).

The portable device 1500 may also include an image processing module 1515 for handling the received and transmitted information, and a virtual display system 1520 to support viewing of images. The virtual display system 1520 can include a micro-display or an imager 1525 and an optical engine 1530. The image processing module 1515 may be operatively connected to the optical engine 1530 to provide image data, such as video data, to the imager 1525 to display an image thereon. An exit pupil expander (EPE) 1535 can be optically linked to an optical engine 1530. The EPE may incorporate or be part of a display system that supports augmented reality or virtual reality images.

The present enablement of device power-on with proper assembly may also be utilized in an augmented reality or virtual reality display system utilized in non-portable devices, such as gaming devices, multimedia consoles, personal computers, vending machines, smart appliances, Internet-connected devices, and home appliances, such as an oven, microwave oven and other appliances, and other non-portable devices.

The present enablement of device power-on with proper assembly may also be utilized in an augmented reality or virtual reality display system utilized in non-portable devices, such as gaming devices, multimedia consoles, personal computers, vending machines, smart appliances, Internet-connected devices, and home appliances, such as an oven, microwave oven and other appliances, and other non-portable devices.

Various exemplary embodiments of the present device power-on with proper assembly are now presented by way of illustration and not as an exhaustive list of all embodiments. An example includes a wearable electronic device, comprising: first, second, and third connectors; a flexible printed circuit; a first battery pack operatively coupled to the flexible printed circuit with the first connector; a second battery pack operatively coupled to the flexible printed circuit with the second connector; a main logic board operatively coupled to the flexible printed circuit with the third connector; a first protection circuit module disposed in the first battery pack and configured to selectively enable and disable power output from the first battery pack; a second protection circuit module disposed in the second battery pack and configured to selectively enable and disable power output from the second battery pack; and a sensing circuit disposed along the flexible printed circuit and main logic board and including one or more sensing signal paths coupling the first and second protection circuit modules through each of the first, second, and third connectors, wherein the first battery pack provides a first sensing signal over the sensing circuit and the second battery pack is configured to provide a second sensing signal over the sensing circuit, and the first protection circuit module enables power output from the first battery pack when it detects the second sensing signal over the sensing circuit and disables power output from the first battery pack when it fails to detect the second sensing signal over the sensing circuit, and the second protection circuit module enables power output from the second battery pack when it detects the first sensing signal over the sensing circuit and disables power output from the second battery pack when it fails to detect the first sensing signal over the sensing circuit.

In another example, the main logic board is disposed in a front section of the wearable electronic device that is configured to be located proximate to a user's face or forehead when the wearable electronic device is worn by the user. In another example, at least a portion of the flexible printed circuit is disposed in the front section of the wearable electronic device. In another example, the first and second battery packs are respectively disposed in left-side and right-side sections of the wearable electronic device, the left-side section being located proximate to a left-side of a user's head when the wearable electronic device is worn by the user, and the right-side section being located proximate to a right-side of the user's head when the wearable electronic device is worn by the user. In another example, the first connector is located proximate to an interface between the front section and the left-side section and the second connector is located proximate to an interface between the front section and the right-side section. In another example, the wearable electronic device further includes one or more field effect transistors (FETs) in each of the first and second protection circuit modules. In another example, the one or more sensing signal paths are low power paths. In another example, each of the protection circuit modules includes logic configured to implement state awareness of connector integrity. In another example, the wearable electronic device further comprises a main power bus distributed over the flexible printed circuit and main logic board in which power from the first and second battery packs is output from respective first and second protection circuit modules to the main power bus. In another example, the wearable electronic device is implemented in a head mounted display device.

A further example includes an assembly configured for use in an electronic device, comprising: an intermediate circuit sub-assembly comprising a flexible printed circuit or a printed circuit board; a first battery pack comprising a first set of one or more battery cells and a first protection circuit module configured to switch power on and off from the first battery pack; a second battery pack comprising a second set of one or more battery cells and a second protection circuit module configured to switch power on and off from the second battery pack; a power bus disposed in the intermediate circuit sub-assembly; a first connector configured to operatively couple the first battery pack to the intermediate circuit sub-assembly and providing at least one electrical connection from the first battery pack to the power bus; a second connector configured to operatively couple the second battery pack to the intermediate circuit sub-assembly and providing at least one electrical connection from the second battery pack to the power bus; and wherein the first and second protection circuit modules are each configured to verify, as conditions to be satisfied prior to switching power output on to the power bus, that electrical continuity is established between the first battery pack and the intermediate circuit sub-assembly at the first connector, and, electrical continuity is established between the second battery pack and the intermediate circuit sub-assembly at the second connector.

In another example, the assembly further comprises: a main logic circuit sub-assembly comprising a second flexible printed circuit or a second printed circuit board; and a third connector configured to operatively couple the intermediate circuit sub-assembly to the main logic circuit sub-assembly and providing at least one electrical connection between a portion of the power bus on the intermediate circuit sub-assembly and a portion of the bus disposed on the main logic circuit sub-assembly, and wherein electrical continuity is established between the intermediate circuit sub-assembly and the main logic circuit sub-assembly at the third connector as a condition to be satisfied prior to switching power output on to the power bus. In another example, each of the battery cells in each of the first and second battery packs supplies a nominal voltage and the battery cells are arranged in a parallel configuration so that the power bus operates at the nominal voltage when the assembly is powered on. In another example, verification at each of the first and second protection circuit modules is performed by receiving a sensing signal from the other battery pack over a sensing circuit having a signal path that includes each of the first, second, and third connectors, the sensing signal being received if each of the sub-assemblies is properly assembled at the respective first, second, and third connectors. In another example, the sensing signal is generated when the first and second battery packs are coupled to an external charger. In another example, the assembly further comprises a controller disposed on the main logic circuit sub-assembly, the controller configured to control operation of the sensing circuit. In another example, the controller is configured to maintain awareness of connector state for each of the first, second, and third connectors.

A further example includes a method of assembling a sub-assembly usable in an electronic device, the method comprising: using a first connector, electrically connecting a first battery pack to an intermediate circuit sub-assembly comprising one or more of a first flexible printed circuit or a first printed circuit board, the first battery pack including a first protection circuit module and a first set of one or more battery cells; using a second connector, electrically connecting a second battery pack to the intermediate circuit sub-assembly, the second battery pack including a second protection circuit module and a second set of one or more battery cells; using a third connector, electrically connecting the intermediate circuit sub-assembly to a main logic circuit sub-assembly, the main logic circuit sub-assembly comprising one or more of a second flexible printed circuit or a second printed circuit board; attempting to power on the main logic circuit sub-assembly; and if power-on is unsuccessful, disconnecting and reconnecting one or more of the first, second, and third connectors, and reattempting the power-on, wherein each of the first and second protection circuit modules is configured to sense a state of connection integrity at each of the first, second, and third connectors and enable power-on when connection integrity at each of the first, second, and third connectors is verified by each of the first and second protection circuit modules.

In another example, the first and second protection circuit modules sense the state of connector integrity through a sensing circuit disposed along the intermediate circuit sub-assembly and main logic circuit sub-assembly, the sensing circuit including one or more sensing signal paths coupling the first and second protection circuit modules through each of the first, second, and third connectors. In another example, the method further includes observing a code or message that indicates connection integrity state in the assembled sub-assembly.

The subject matter described above is provided by way of illustration only and should not be construed as limiting. Various modifications and changes may be made to the subject matter described herein without following the example embodiments and applications illustrated and described, and without departing from the true spirit and scope of the present invention, which is set forth in the following claims.

What is claimed:

1. A wearable electronic device, comprising:
   first, second, and third connectors;
   a flexible printed circuit;
   a first battery pack operatively coupled to the flexible printed circuit with the first connector;
   a second battery pack operatively coupled to the flexible printed circuit with the second connector;
   a main logic board operatively coupled to the flexible printed circuit with the third connector;
   a first protection circuit module disposed in the first battery pack and configured to selectively enable and disable power output from the first battery pack;
   a second protection circuit module disposed in the second battery pack and configured to selectively enable and disable power output from the second battery pack; and
   a sensing circuit disposed along the flexible printed circuit and main logic board and including one or more sensing signal paths coupling the first and second protection circuit modules through each of the first, second, and third connectors,
   wherein the first battery pack provides a first sensing signal over the sensing circuit and the second battery pack is configured to provide a second sensing signal over the sensing circuit, and
   the first protection circuit module enables power output from the first battery pack when the first protection circuit module detects the second sensing signal over the sensing circuit and disables power output from the first battery pack when the first protection circuit module fails to detect the second sensing signal over the sensing circuit, and
   the second protection circuit module enables power output from the second battery pack when the second protection circuit detects the first sensing signal over the sensing circuit and disables power output from the second battery pack when the second protection circuit fails to detect the first sensing signal over the sensing circuit.

2. The wearable electronic device of claim 1 in which the main logic board is disposed in a front section of the wearable electronic device that is configured to be located proximate to a user's face or forehead when the wearable electronic device is worn by the user.

3. The wearable electronic device of claim 2 in which at least a portion of the flexible printed circuit is disposed in the front section of the wearable electronic device.

4. The wearable electronic device of claim 1 in which the first and second battery packs are respectively disposed in left-side and right-side sections of the wearable electronic device, the left-side section being located proximate to a left-side of a user's head when the wearable electronic device is worn by the user, and the right-side section being located proximate to a right-side of the user's head when the wearable electronic device is worn by the user.

5. The wearable electronic device of claim 4 in which the first connector is located proximate to an interface between the front section and the left-side section and the second connector is located proximate to an interface between the front section and the right-side section.

6. The wearable electronic device of claim 1 further including one or more field effect transistors (FETs) in each of the first and second protection circuit modules.

7. The wearable electronic device of claim 1 in which the one or more sensing signal paths are low power paths.

8. The wearable electronic device of claim 1 in which each of the protection circuit modules includes logic configured to implement state awareness of connector integrity.

9. The wearable electronic device of claim 1 further comprising a main power bus distributed over the flexible printed circuit and main logic board in which power from the first and second battery packs is output from respective first and second protection circuit modules to the main power bus.

10. The wearable electronic device of claim 1 as implemented in a head mounted display device.

* * * * *